(12) United States Patent
Nakamura et al.

(10) Patent No.: US 7,847,469 B2
(45) Date of Patent: Dec. 7, 2010

(54) MICRO-CANTILEVER

(75) Inventors: Kentaro Nakamura, Gunma (JP); Ryuichi Kondou, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 495 days.

(21) Appl. No.: 12/018,109

(22) Filed: Jan. 22, 2008

(65) Prior Publication Data

US 2009/0026892 A1    Jan. 29, 2009

(30) Foreign Application Priority Data

Jan. 30, 2007    (JP) .............................. 2007-018810

(51) Int. Cl.
*H01L 41/00* (2006.01)
(52) U.S. Cl. ....................... 310/330; 310/364; 310/365; 310/367; 367/160
(58) Field of Classification Search ................ 310/367, 310/365, 364, 330; 29/25.35
See application file for complete search history.

(56) References Cited

U.S. PATENT DOCUMENTS

| | | | | |
|---|---|---|---|---|
| 4,237,399 A | * | 12/1980 | Sakamoto | 310/317 |
| 4,342,936 A | * | 8/1982 | Marcus et al. | 310/330 |
| 5,814,923 A | * | 9/1998 | Shimada | 310/311 |
| 5,914,507 A | * | 6/1999 | Polla et al. | 257/254 |
| 6,134,964 A | * | 10/2000 | Jaenker et al. | 73/514.21 |
| 6,286,943 B1 | * | 9/2001 | Ashe et al. | 347/71 |
| 6,479,920 B1 | * | 11/2002 | Lal et al. | 310/309 |
| 6,895,645 B2 | * | 5/2005 | Xu et al. | 29/25.35 |
| 7,084,554 B2 | * | 8/2006 | Xu et al. | 310/332 |
| 7,161,279 B2 | * | 1/2007 | Topliss et al. | 310/330 |
| 7,245,057 B2 | * | 7/2007 | Ma et al. | 310/312 |
| 7,420,318 B1 | * | 9/2008 | Pulskamp | 310/328 |
| 2005/0151444 A1 | * | 7/2005 | Mehta | 310/313 B |

FOREIGN PATENT DOCUMENTS

JP    2005-332802    12/2005

* cited by examiner

*Primary Examiner*—Walter Benson
*Assistant Examiner*—Bryan P Gordon
(74) *Attorney, Agent, or Firm*—Law Office of Katsuhiro Arai

(57) ABSTRACT

A micro-cantilever of a simple structure and capable of obtaining a larger displacement at a low voltage including a plate-like piezoelectric substrate having electrode films as an upper electrode and a lower electrode formed on both surfaces thereof, a plate-like resilient member in close contact with the piezoelectric substrate on the side of the lower electrode and a support for supporting a driving member in a cantilever manner, in which a thin-walled portion is formed to the vicinity of a base portion of the driving member supported by the support.

7 Claims, 9 Drawing Sheets

[FIG. 1]
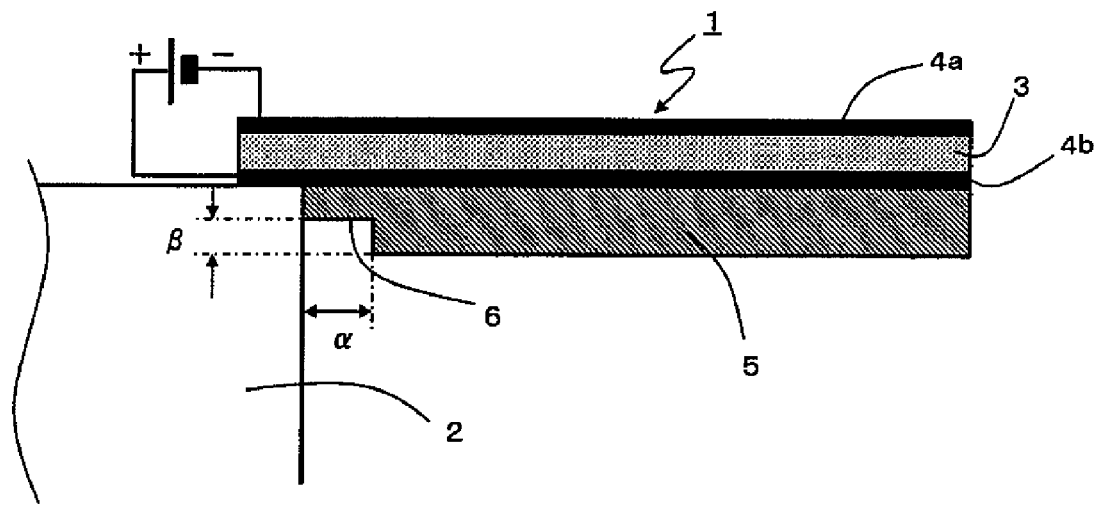
[FIG. 2]
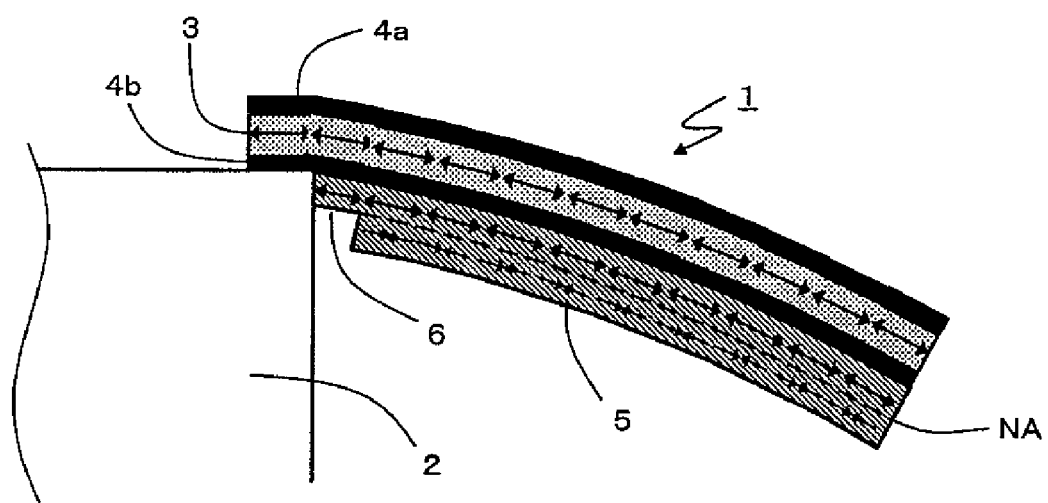

[FIG. 3]
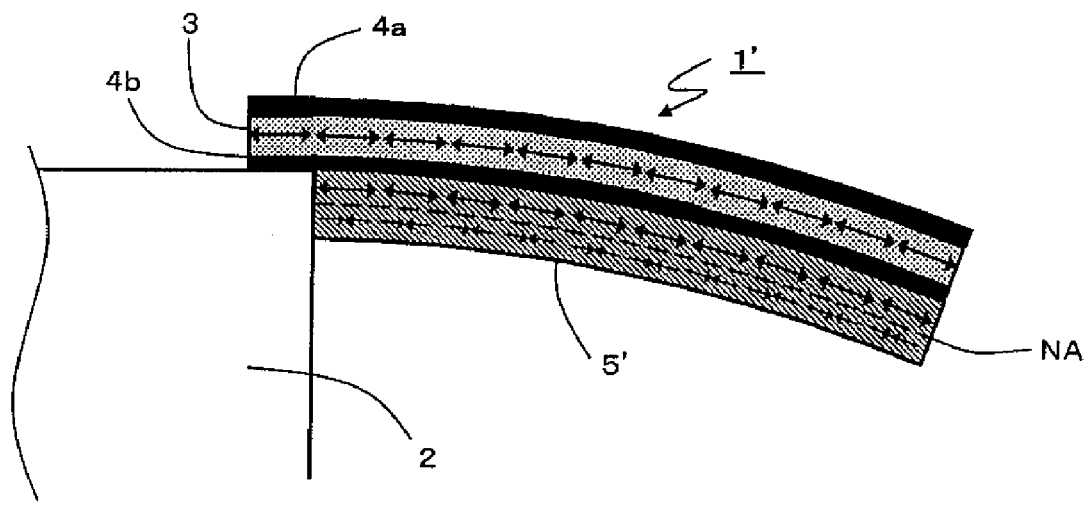
PRIOR ART
[FIG. 4]
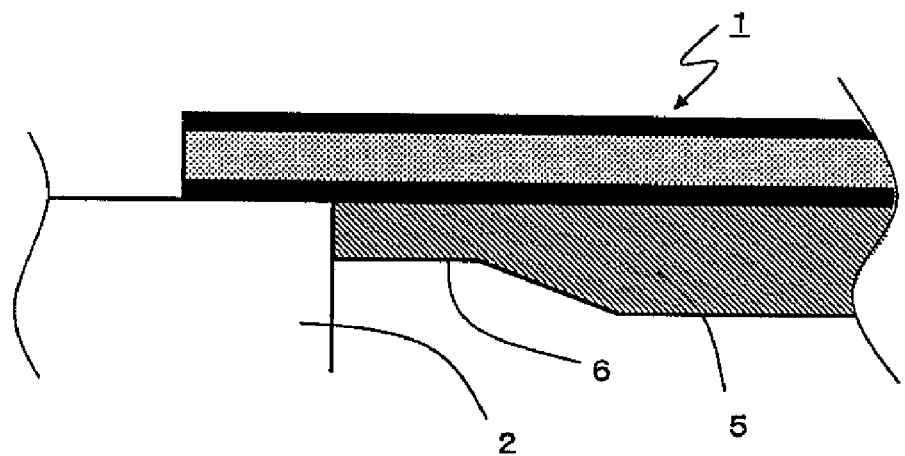

[FIG. 5]
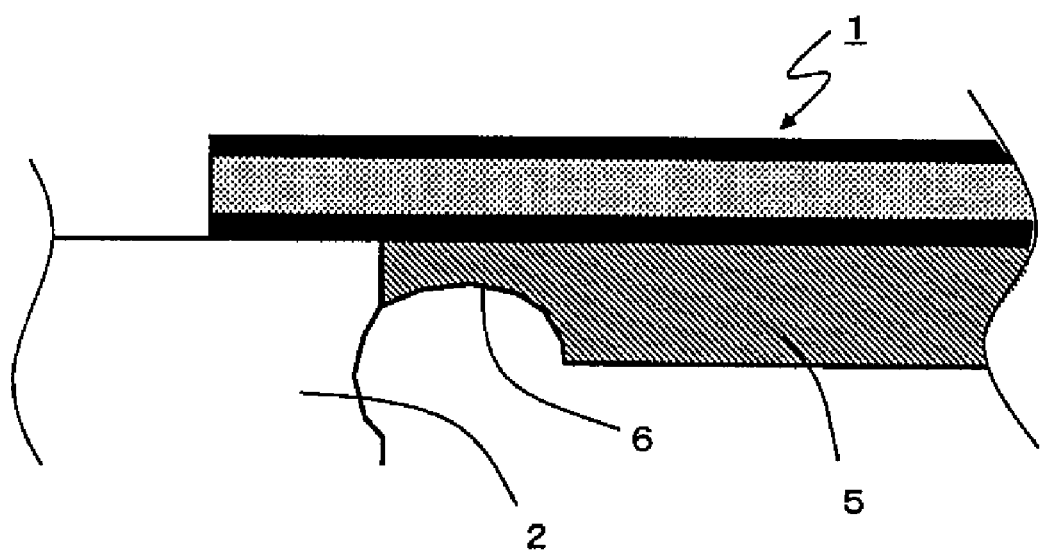

[FIG. 6]
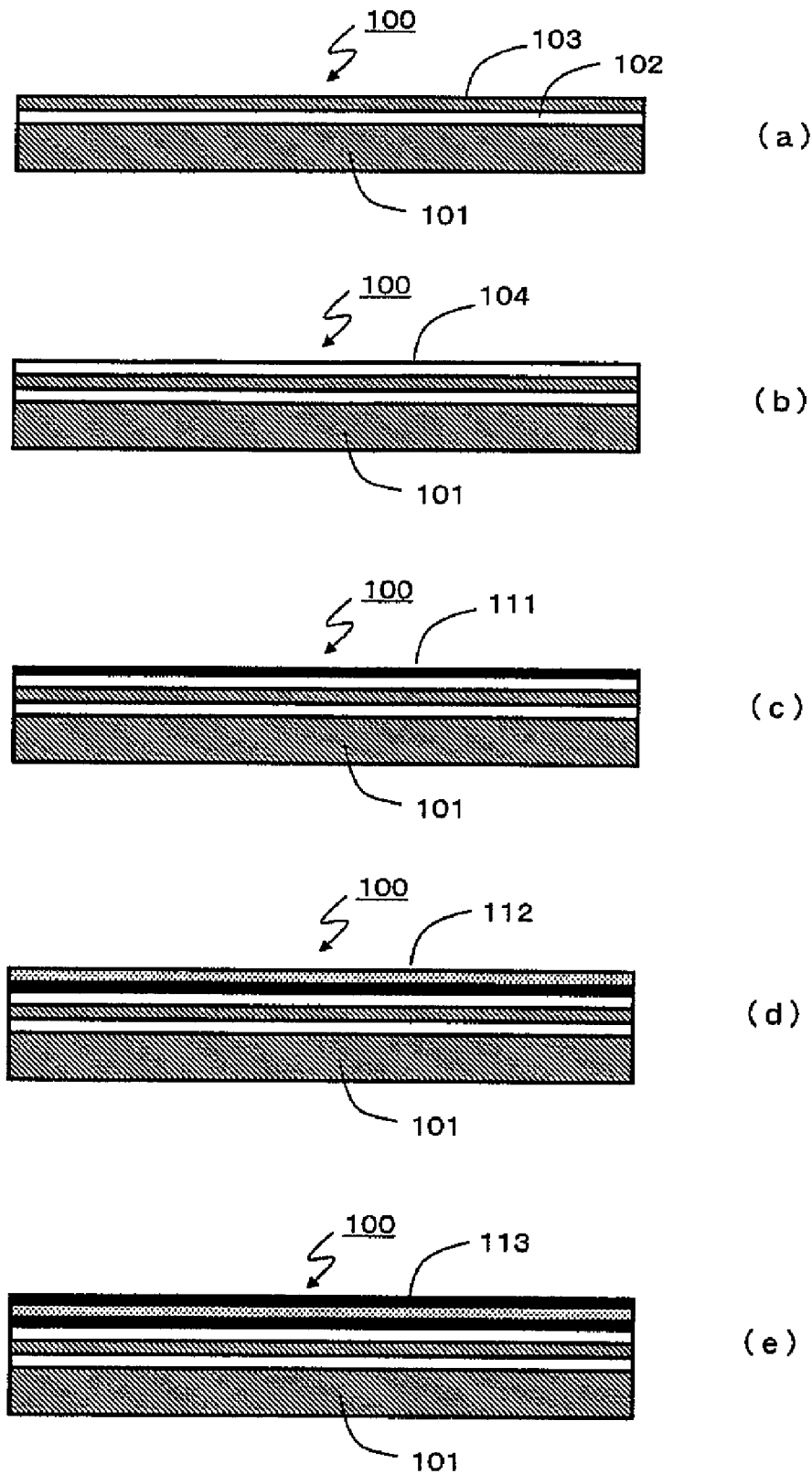

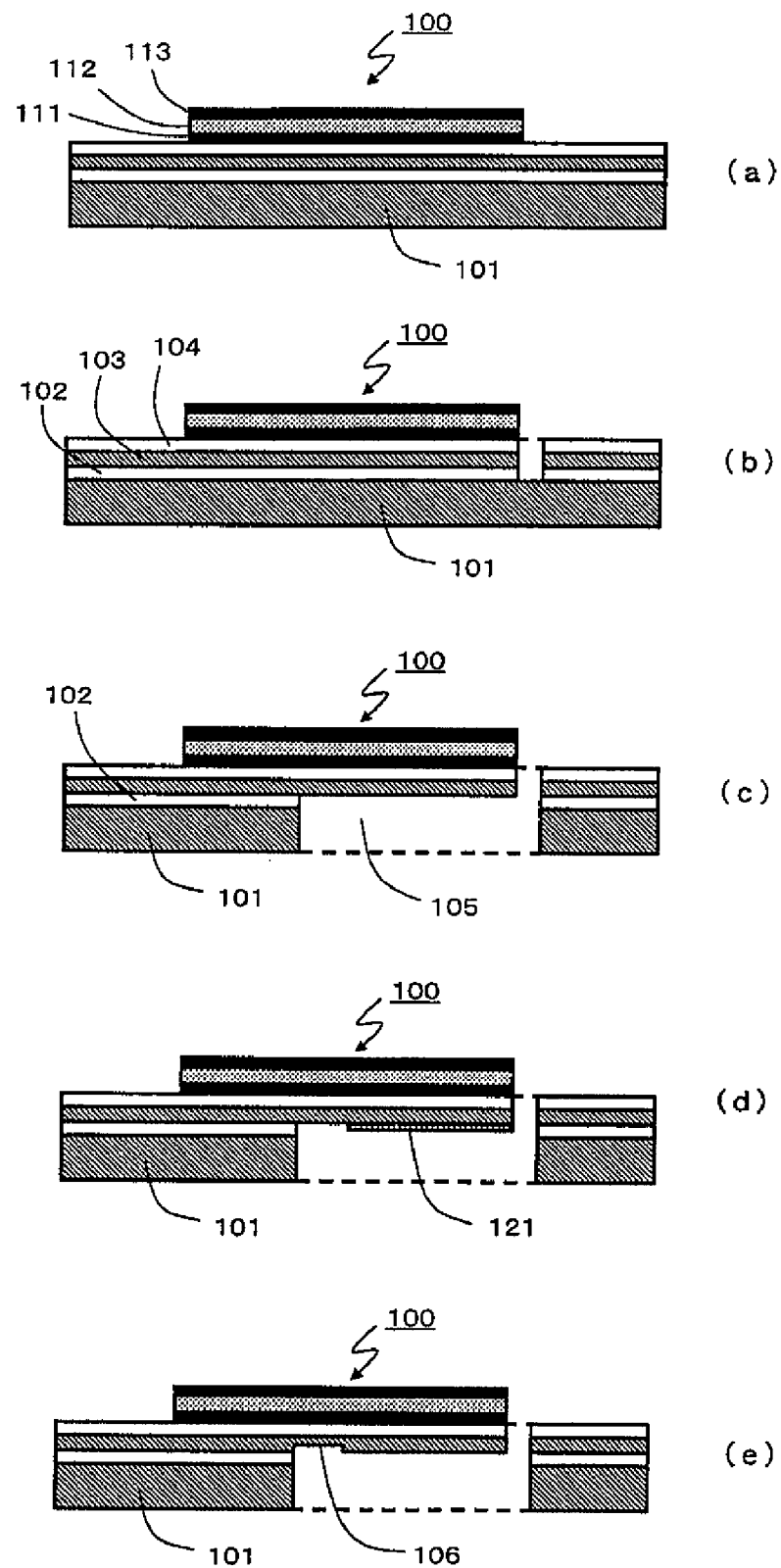
[FIG. 7]

[FIG. 13]
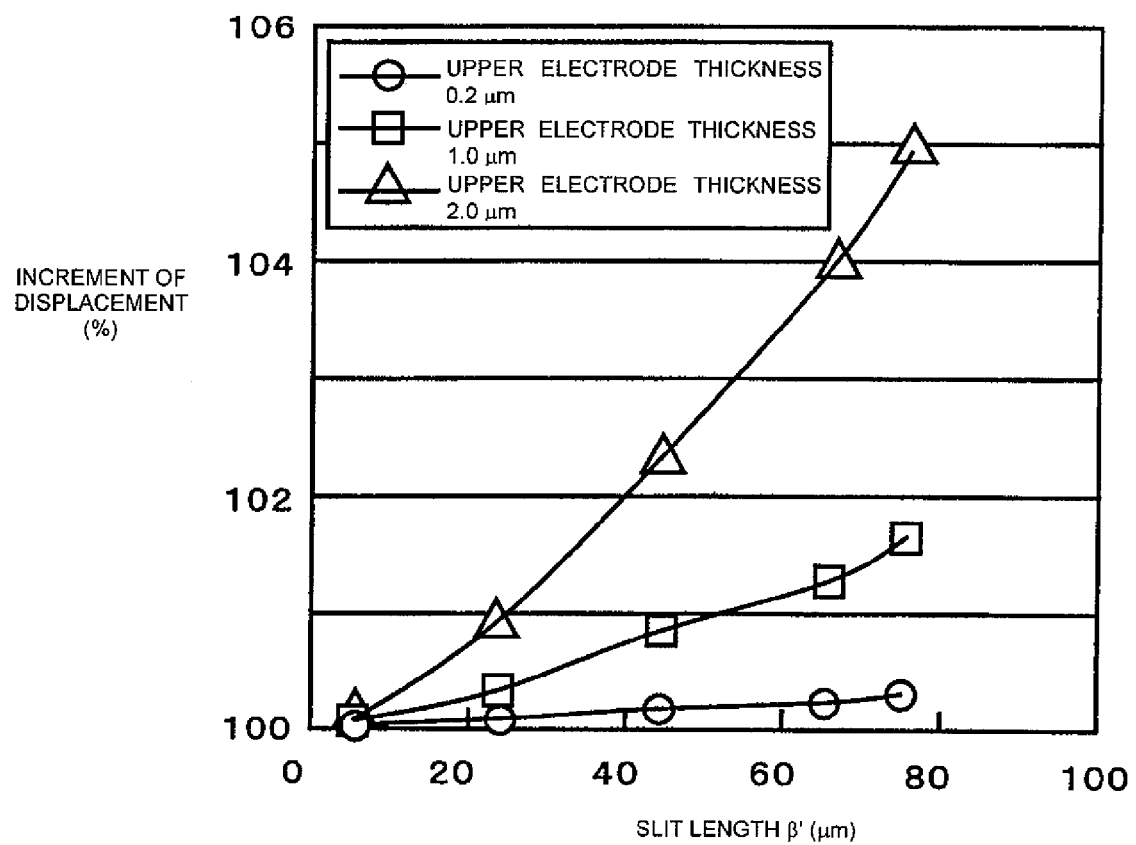

MICRO-CANTILEVER

BACKGROUND OF THE INVENTION

1. Field of the Invention

The present invention concerns a micro-cantilever as a driving portion of an MEMS device (microelectromechanical coupling device) such as a micro-switch or a micro-actuator.

2. Description of the Related Technology

Various electronic equipments used in high frequency bands, for example, mobile telephones or wireless equipments have been decreased in the size and the weight and improved in the performance. Correspondingly, micro-switches utilizing the MEMS technique instead of semiconductor switches such as FET (field effect transistor) or PIN diodes used for controlling signals in existent electronic equipments have been proposed. Such MEMS devices can add, to electric circuits, a feature that can be difficult to attain by the electric circuit alone. For example, by replacing mechanical relays, FET, and PIN diodes used as switching devices for electric circuits with MEMS switches, it can be expected for the improvement of characteristics that have been dependent on materials such as decrease of isolation or insertion loss in high frequency regions of 10 GHz or more, or widening of frequency regions to be used. Further, since the MEMS device has a good matching property with production processes for semiconductor devices, hybrid devices integrated with thin film capacitors or thin film inductances can also be attained.

In recent years, a problem has been increased for the battery driving time along with decrease in the size and improvement for the function in mobile telephones, wireless equipments or the like. Therefore, a demand for decreasing the consumption power and low voltage driving has been increased. The MEMS technique involves several driving systems such as electrostatic, electromagnetic, and thermal driving systems. Among them, thermal driving or electromagnetic driving increases consumption power by a supply of current. Further, the electrostatic driving consumes less power since the current is not supplied but generally requires a voltage as high as 20 to 50 V. In view of the above, a piezoelectric substrate has been noted as a system capable of making less consumption power and low voltage driving compatible and an MEMS switch using the same has been proposed, for example, in JP-A-2005-332802, and the like.

The MEMS device using such a piezoelectric substrate includes those having a micro-cantilever for a driving portion. The micro-cantilever has a structure of bonding a plate-like piezoelectric substrate formed with electrodes on both surfaces thereof and a plate-like resilient member such as made of a metal or metal oxide and is supported in a cantilever manner on a support such as a substrate. In such a structure, the piezoelectric substrate displaces by the application of a voltage to electrodes to bend a micro-cantilever and it returns to an original state by the resiliency of the resilient member upon interruption of current supply to the electrodes. By utilizing the action described above, it is possible to form a micro-switch by disposing an electric contact at the top end of the micro-cantilever or form a micro-actuator having a micro-cantilever as a driving portion conducting vibrating or swinging movement.

SUMMARY OF CERTAIN INVENTIVE ASPECTS

The magnitude of the displacement of the piezoelectric substrate is in proportion with a voltage to be applied. Accordingly, it is necessary to increase the applied voltage for increasing the displacement of the micro-cantilever. However, since low voltage driving is necessary for the MEMS device, it is desired that a larger displacement can be obtained than usual for an identical voltage on the micro-cantilever, or an identical displacement can be obtained by a lower voltage than usual.

For attaining a low voltage driving of the micro-cantilever using the piezoelectric substrate, there is a method of decreasing the thickness of the piezoelectric substrate and the resilient member as thin as possible. However, in decreasing the film thickness, control for making the film thickness uniform is difficult and there has been a limit in suppressing lowering of characteristics such as piezoelectric characteristics. Further, for increasing the amount of displacement, while a method of connecting a plurality of micro-cantilevers to amplify the amount of displacement has been considered as in JP-A-2005-332802, such a constitution involves a problem of increasing the cost since the number of steps for film formation or fabrication is increased and the steps are complicated.

One inventive aspect relates to methods of obtaining a micro-cantilever having a simple structure that can obtain a larger displacement amount at a low voltage.

The present inventors have found that a plate-like piezoelectric substrate constituting a micro-cantilever causes displacement in the longitudinal direction perpendicular to the direction of the thickness, the displacement in the longitudinal direction can be converted into bending in the direction of the thickness by the presence of a resilient member and, since the resilient member has a reaction to the bending simultaneously with the bending, the amount of the displacement of the micro-cantilever can be increased by a structure of decreasing the reaction to the bending. Then, one inventive aspect relates to a micro-cantilever including a plate-like piezoelectric substrate having an upper electrode formed substantially over the entire one surface thereof and a lower electrode formed substantially over the entire the other surface, a plate-like resilient member in close contact with the surface of the piezoelectric substrate to be formed with the lower electrode so as to be structurally integral therewith, and a support for supporting, in the cantilever manner, the vicinity at one end in the longitudinal direction of a driving member formed by close contact of the piezoelectric substrate and the resilient member, in which a thin-walled portion having a thickness less than that of other portions in the driving member is formed in the vicinity of a base portion of the driving member supported by the support.

According to one inventive aspect, by the provision of a thin-walled portion to a base portion supported on the support, the reaction to the bending of the portion can be lowered. Further, by lowering the reaction to the bending, since the displacement at the base portion is made larger than the displacement for other portions of the micro-cantilever, the displacement in the thin-walled portion is amplified by the principle of fulcrum to increase the displacement at the free end of the micro-cantilever.

Further, a method of forming the thin-walled portion includes a method of decreasing the thickness of the resilient member. That is, one inventive aspect provides a micro-cantilever wherein the thin-walled portion is a portion where the thickness of the resilient member is decreased. The resilient member has a function of converting the displacement in the longitudinal direction of the piezoelectric substrate at a portion near the piezoelectric substrate into bending but generates a reaction against the bending at a portion remote from the piezoelectric substrate, so that by decreasing the thickness of the resilient member at the base portion, the reaction against the bending at the portion can be lowered to increase the amount of bending displacement of the micro-cantilever.

Further, the electrode formed to the piezoelectric substrate also has a resiliency and acts as the resilient member. Accordingly, one inventive aspect provides, as another aspect, a micro-cantilever wherein the thin-walled portion is a portion where a portion of the upper electrode is slit or recessed. By slitting or recessing a portion of the upper electrode at the base portion to remove a metal film, the reaction against the bending in the portion can be lowered to increase the amount of bending displacement of the micro-cantilever.

One inventive aspect provides a micro-cantilever of a simple structure and capable of obtaining a larger amount of bending displacement at a low voltage.

BRIEF DESCRIPTION OF THE DRAWINGS

FIG. 1 is a schematic cross sectional view showing a first embodiment of a micro-cantilever according to the invention;

FIG. 2 is a schematic cross sectional view showing the operation of the first embodiment of the micro-cantilever according to the invention;

FIG. 3 is a schematic cross sectional view showing the operation of an existent micro-cantilever;

FIG. 4 is a schematic cross sectional view showing another example of the first embodiment of the micro-cantilever according to the invention;

FIG. 5 is a schematic cross sectional view showing a further example of the first embodiment of the micro-cantilever according to the invention;

FIGS. 6A to 6E are schematic cross sectional views showing a method of manufacturing a micro-cantilever according to one embodiment;

FIGS. 7A to 7E are schematic cross sectional views showing a method of manufacturing a micro-cantilever according to one embodiment;

FIG. 13 is a graph showing a relation between the thickness and the slit length $\beta$ of an upper electrode and the displacement increment of a micro-cantilever.

DESCRIPTION OF CERTAIN EMBODIMENTS

Figure 8A:
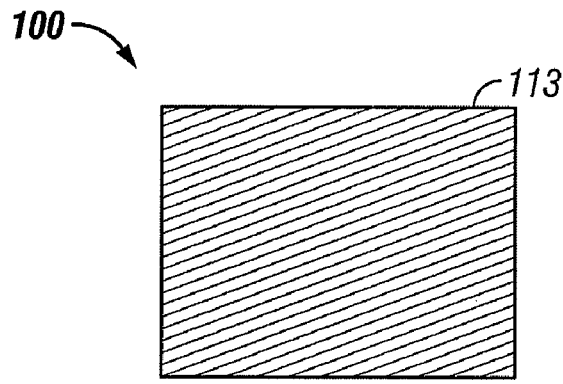
FIGS. 8A to 8D are schematic plan views showing a method of manufacturing a micro-cantilever according to one embodiment, in which FIG. 8A corresponds to FIG. 6E, FIG. 8B corresponds to FIG. 7A, FIG. 8C corresponds to FIG. 7B, and FIG. 8D corresponds to FIG. 7C and succeeding drawings.

A first embodiment according to the micro-cantilever of the invention is to be described with reference to the drawings. FIG. 1 is a schematic cross sectional view showing a first embodiment of a micro-cantilever of the invention. A micro-cantilever 1 has a structure in which electrode films as an upper electrode 4a and a lower electrode 4b are formed over the entire both surfaces of a substantially rectangular plate-like piezoelectric substrate 3, a plate-like resilient member 5 is in close contact with the piezoelectric substrate 3 on the side of the lower electrode 4b so as to be structurally integrated therewith to constitute a driving member. The driving member is supported in a cantilever manner to a support 2. Further, in the resilient member 5, a thin-walled portion 6 is formed near the base portion supported to the support 2. The micro-cantilever 1 is driven by applying a voltage across the upper electrode 4a and the lower electrode 4b to displace the piezoelectric substrate 3.

The piezoelectric substrate 3 is formed, for example, into a rectangular plate-like shape by a thin film forming method such as CVD or sputtering, or a sol-gel method and then scraping after film formation by etching or the like, or conducting masking during film formation. The material used for the piezoelectric substrate includes, for example, lead zirconium titanate, lead zirconate, lead titanate, lead magnesium niobate, lead nickel niobate, barium titanate, sodium bismuth titanate, potassium sodium niobate, and strontium bismuth tantalate. The piezoelectric substrate 3 is applied with a polarizing treatment of aligning the polarizing direction for displacement by electric supply. The polarizing treatment is conducted by applying, e.g., an electric field of about 150 to 500 kV/cm to the piezoelectric substrate.

The upper electrode 4a and the lower electrode 4b are formed respectively on the surface and the rear face of the piezoelectric substrate 3 by a thin-film forming method such as CVD or sputtering. Referring to the order of forming them, they are formed by a method of providing a piezoelectric substrate 3 and forming the electrodes to the surface and the rear face respectively, a method of forming them while stacking in the order of: lower electrode 4b→piezoelectric substrate 3→upper electrode 4a. The material used for the electrode includes elements of metals such as Pt, Pd, Ag, Cu, Ni, Al, Cr, Fe, Co, Zn, Sn, and Ti or alloys thereof.

The resilient member 5 is formed of a resilient member such as semiconductor materials, for example, Si, $SiO_2$, ceramics, for example, alumina or zirconia, or metals, for example, Fe, Ni, and Cu as a single member or a laminate of a plurality kinds of members. The resilient member 5 is formed by providing a plate-like member comprising the material described above, or by scraping from a support to be described later by etching or the like. A driving member is formed by integrally forming the resilient member 5 and the piezoelectric substrate 3 formed with the upper electrode 4a and the lower electrode 4b so as to be in close contact with each other. The method of forming the driving member includes a method of bonding the resilient member 5 to the piezoelectric substrate 3 on the side of the lower electrode 4b and a method of forming the lower electrode 4b on the resilient member 5 by CVD or sputtering, etc. and then forming the piezoelectric substrate 3 and the upper electrode 4a successively.

The support 2 is formed of a semiconductor substrate such as made of an Si wafer or a ceramic substrate such as made of alumina or zirconia and supports the driving member in a cantilever manner. The support 2 may be integrated with the resilient member 5. Further, the support may also be formed with other electronic parts, wiring conductors, etc. other than the micro-cantilever 1. In the following descriptions and drawings, other electronic parts or wiring conductors than the micro-cantilever 1 are omitted.

The thin-walled portion 6 formed to the resilient member 5 is formed near the base portion of the driving member supported by the support 2. The thin-walled portion 6 is formed at a length $\alpha$ and a depth $\beta$ from the base portion fixed to the support 2. While depending on the material constituting the driving member, $\alpha$ is about from 0.5 to 30 μm in a case where the length is, for example, 500 μm. $\beta$ is about 10 to 80% to the thickness of the resilient member 5. The thickness of the driving member at the thin-walled portion 6 is decreased by so much as $\beta$ than the thickness for other portions.

Then, the operation of the micro-cantilever is to be described. FIG. 2 is a schematic cross sectional view showing the operation in a first embodiment of the micro-cantilever of the invention. FIG. 3 is a schematic cross sectional view showing the operation in the existent micro-cantilever. In the subsequent description, it is assumed that the polarizing direction of the piezoelectric substrate 3 is a direction from the upper electrode 4a to the lower electrode 4b, and the direction of the voltage applied upon operation of the micro-cantilever is a direction from the lower electrode 4b to the upper electrode 4a.

Without being bound to any particular theories of operation, the operation principle of the micro-cantilever is considered to be as described below. When a DC voltage is applied across the upper electrode 4a and the lower electrode 4b, the piezoelectric substrate 3 tends to elongate in the longitudinal direction as shown in FIG. 2 and FIG. 3. In this case, the resilient member 5 or 5' undergoes a tensile stress in the longitudinal direction. In this instance, the reaction exerts by the resiliency tending to pull back the piezoelectric substrate 3. Thus, the micro-cantilever 1 or 1' is displaced and bent. In this case, in the resilient member 5 or 5', the side near the piezoelectric substrate 3 with respect to the neutral plane NA as a boundary undergoes a tensile stress to displace the micro-cantilever 1 or 1'. However, the side remote from the piezoelectric substrate 3 than the neutral plane NA undergoes a compression stress. Accordingly, a force tending to push back the displacement of the piezoelectric substrate 3 is generated by the reaction of the compression stress.

In this case, in the micro-cantilever 1 of one embodiment, since the thickness is decreased for the portion of the thin-walled portion 6 on the side remote from the piezoelectric substrate 3 than the neutral plane NA that undergoes the compression stress, the reaction of the compression stress tending to push back the displacement of the piezoelectric substrate 3 is decreased than that for other portions and in the existent micro-cantilever 1'. Accordingly, the displacement is enlarged in the portion where the thin-walled portion 6 is present. Since the thin-walled portion 6 is at the base portion of the micro-cantilever 1 it is possible to amplify the displacement of the thin-walled portion 6 to increase the displacement of the top end of the micro-cantilever 1 according to the principle of the leverage. This can provide a micro-cantilever 1 having an amount of bending displacement larger than that of the existent micro-cantilever 1'. This is identical also in a case where the voltage is applied in the opposite direction to cause displacement in the opposite direction. The position for the neutral plane NA is determined by the thickness and the Young's modulus of the piezoelectric substrate 3 and the resilient member 5 that constitute the micro-cantilever 1. Accordingly, in a case of decreasing the thickness of the entire resilient member 5, for example, the position for the natural plane NA changes correspondingly, and, as a result, the thickness of the resilient member on the side near the piezoelectric substrate 3 is decreased, so that the effect of displacing the micro-cantilever 1 itself decreases failing to obtain the effect of one embodiment.

The shape of the thin-walled portion 6 may be a tapered shape as shown in FIG. 4 in addition to the cross sectional rectangular shape as shown in FIG. 1. Further, it may be a substantially circular cross sectional shape as shown in FIG. 5. Further, it may be a shape for engraving a portion of the support 2 to a so-called counter sunk shape as shown in FIG. 5. When the micro-cantilever 1 displaces downward, the counter sunk portion can keep a portion of the resilient member 5 from abutting against the support 2, so as not to hinder the displacement. Further, the depth β for the thin-walled portion 6 preferably reaches the vicinity of the neutral plane NA to such an extent as not exceeding the neutral plane NA as shown in FIG. 2.

Then, a method of manufacturing a micro-cantilever is to be described. In this case, this is described, for example, as a manufacturing method by a thin film process of forming a layer by CVD or the like and then conducting scraping by etching or the like. At first, as shown in FIG. 6A, an SOI (Silicon on Insulator) wafer 100 is provided. The SOI wafer 100 has a structure in which an $SiO_2$ layer 102 is formed on an Si substrate 101 and an Si layer 103 is formed thereon.

Successively as shown in FIG. 6B, an Si oxide film 104 is formed on an SOI wafer 100 by CVD. The Si oxide film 104 subsequently constitutes a portion of a resilient member. Successively, as shown in FIG. 6C, a Pt metal film is formed by sputtering on the Si oxide film 104 to form a lower electrode 111. Successively, as shown in FIG. 6D, a layer of lead zirconium titanate is formed by a sol-gel method on the lower electrode 111 to form a piezoelectric layer 112. Successively, as shown in FIG. 6E, a Pt metal film is formed by sputtering on the piezoelectric layer 112 to form an upper electrode 113. As described above, necessary layers for the micro-cantilever are formed to form a wafer as shown in FIG. 8A. In addition, a protection film for protecting the upper electrode 113 and a control layer for controlling the amount of displacement of the micro-cantilever with Young's modulus or the like may also be formed optionally. The material used for the protection layer or the control layer includes, for example, Ta. In a case of forming the protection layer, the layer is formed to a thickness sufficiently smaller than that of the piezoelectric layer 112 so as to be free from the effect of Young's modulus of Ta. In a case of forming the control layer, it is formed to such a thickness as can utilize the Young's modulus of Ta.

Figure 8B:
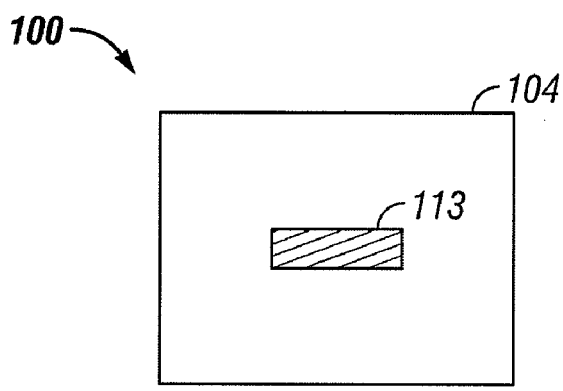

Successively, as shown in FIG. 7A and FIG. 8B, the upper electrode 113, the piezoelectric layer 112, and the lower electrode 111 are removed by etching to form a driving member. For the removal of the upper electrode 113 and the lower electrode 111, dry etching using an Ar gas is used in an ECR (electron cyclotron resonance etching) apparatus. Further, for the removal of the piezoelectric layer 112, wet etching using nitric acid+10% hydrogen fluoride solution is used as the etching solution. A portion to be left is coated with a resist or the like on the surface thereof to which a pattern is transferred for protection.

Figure 8C:
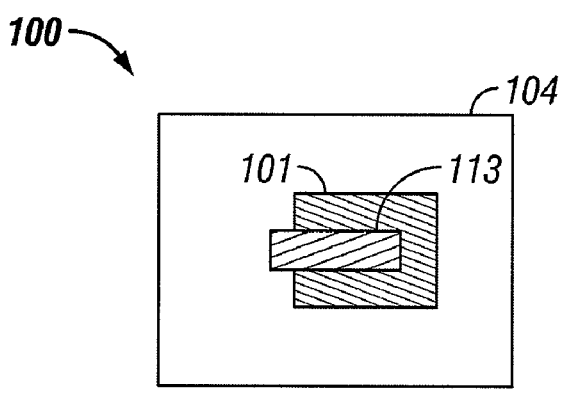

Successively, as shown in FIG. 7B and FIG. 8C, the Si oxide film 104, the Si layer 103, and the $SiO_2$ layer 102 are removed at the periphery of the driving member by dry etching to form a structure of supporting the driving member in a cantilever manner. For dry etching, a D-RIE (deep reactive ion etching) apparatus is used, and $CHF_3$ is used for the Si oxide film 104 and the $SiO_2$ layer 102, and $SF_6$, $C_3F_8$ or the like is used to the Si layer 103 as the etching gas.

Figure 8D:
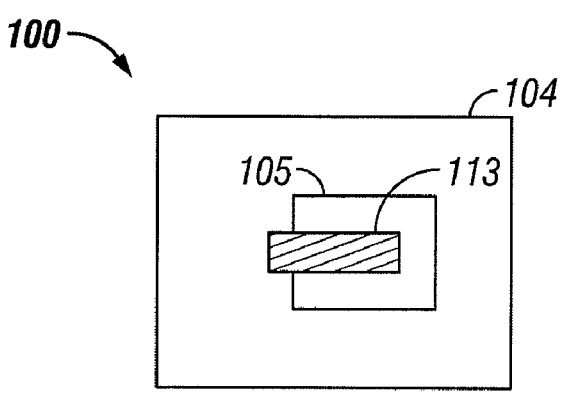

Successively, as shown in FIG. 7C and FIG. 8D, the Si substrate 101 and the $SiO_2$ layer 102 are removed by dry etching using the D-RIE apparatus from the rear face of the SOI wafer 100 (side not formed with the driving member) to form a space 105 for driving the micro-cantilever. As described above, a micro-cantilever in which the resilient member is formed of the Si layer 103 and the Si oxide film 104 and integrated with the SOI wafer 100 as the support is obtained.

Successively, a thin-wall portion 106 is formed to the resilient member of the micro-cantilever. At first, as shown in FIG. 7D, a resist 121 is coated to the surface other than the portion near the fixing end to the support of the Si layer 103 as the resilient member. The thickness and the etching selectivity, etc. are controlled for the resist layer 121 for controlling the depth of the thin-walled portion 106. Successively, the portion near the fixing end of the Si layer 103 is removed by dry etching using a D-RIE apparatus to form the thin-walled portion 106 as shown in FIG. 7E.

Then, a polarizing treatment is applied to the piezoelectric substrate 112. A DC voltage is applied across the upper electrode 113 and the lower electrode 111 and the polarizing treatment is applied, e.g., for about 1 to 10 min at an electric field intensity of 150 to 500 kV/cm. The applied voltage may be from 15 to 50V for thickness of the piezoelectric substrate 112, for example, of 1 μm.

Then, the effect of the first embodiment of the micro-cantilever of the invention is to be described. At first, by the manufacturing method described above, a micro-cantilever 1 having 500 μm length, 150 μm width, and 6.8 μm thickness is formed. The length is a distance from the fixing end of the support 2 to the top end. The size and the physical properties, etc. for each of the layers constituting the micro-cantilever 1 are as shown in Table 1.

TABLE 1

| | Unit | Si | Si oxide film | Lower electrode (Pt) | Piezoelectric layer (PZT) | Upper electrode (Pt) |
|---|---|---|---|---|---|---|
| Thickness | μm | 5 | 0.6 | 0.2 | 0.8 | 0.2 |
| Width | μm | 150 | 150 | 100 | 100 | 100 |
| Young's Modulus | Pa | 1.68E+11 | 6.80E+10 | 1.71E+11 | 7.30E+10 | 1.71E+11 |
| Piezoelectric constant d31 | — | — | — | — | −1.00E−10 | — |
| Relative permittivity | — | — | — | — | 1200 | — |

Then, micro-cantilevers having the thin-walled portion 6 with the length α of 0.5 μm, 5.0 μm, 10 μm, and 30 μm were provided respectively and specimens with the depth β of 1.0 μm, 2.0 μm, 3.0 μm, 3.5 μm, 4.0 μm, and 4.5 μm for each length were prepared.

Figure 9:
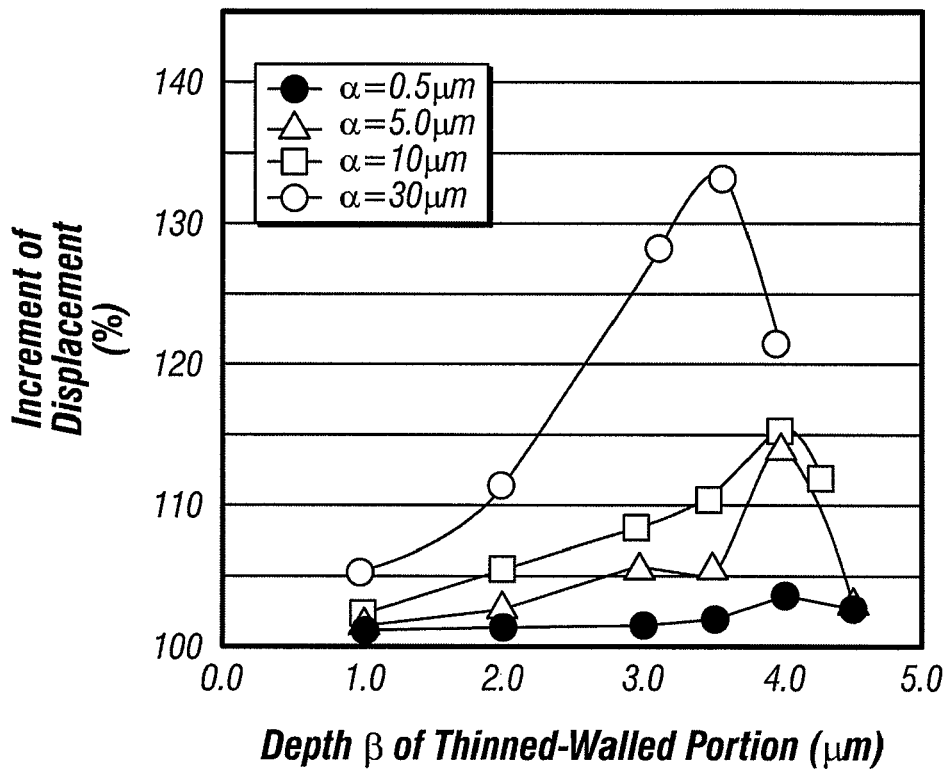
FIG. 9 is a graph showing a relation between the length $\alpha$ and the depth $\beta$ of a thin-walled portion and a displacement increment of a micro-cantilever.

A DC voltage at 10V was applied to each of the specimens, the displacement was measured, and the increment of displacement was calculated based on the displacement of a standard specimen not formed with the thin-walled portion 6 being assumed as 100%. The result is shown in the graph of FIG. 9.

From the results, it has been found that increase of the displacement amount of about 5 to 30% was obtained by controlling the shape of the thin-walled portion 6 formed to the resilient member 5.

Figure 10:
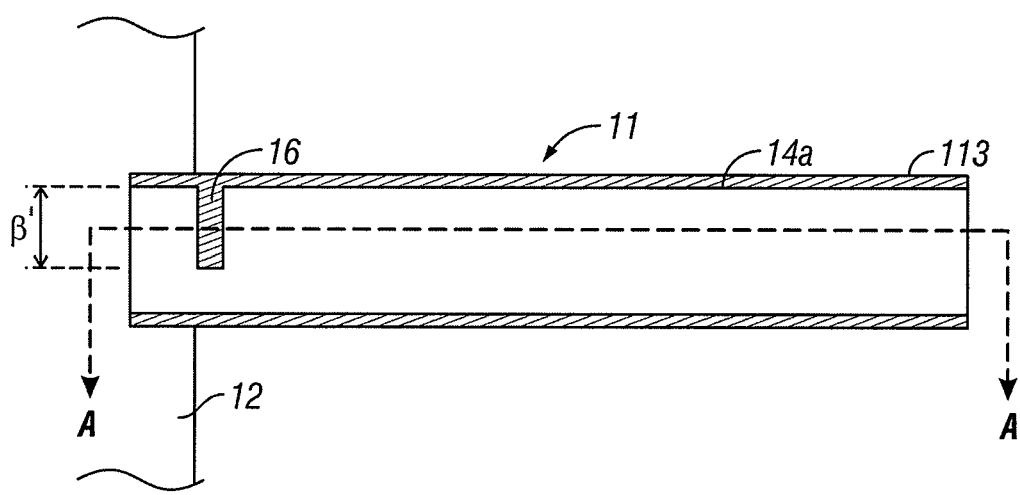
FIG. 10 is a schematic plan view showing a second embodiment of a micro-cantilever according to the invention.
Figure 11:
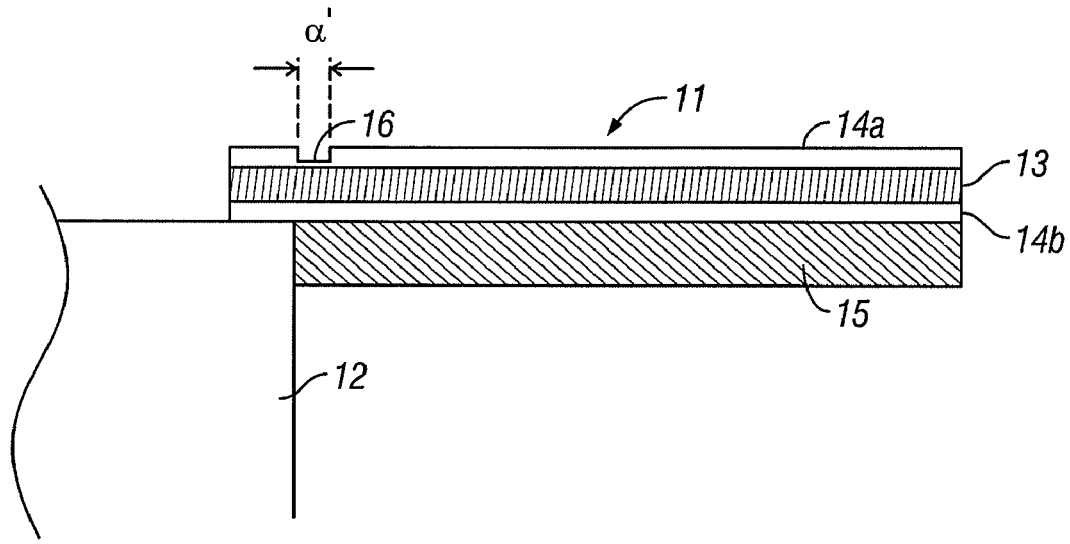
FIG. 11 is a schematic cross sectional view taken along line A-A in FIG. 10.

Then, a second embodiment according to the micro-cantilever of the invention is to be described. FIG. 10 is a schematic plan view showing the second embodiment of the micro-cantilever of the invention and FIG. 11 is a schematic cross sectional view thereof. The micro-cantilever 11 has a feature that the thin-walled portion 16 is formed by removing a portion of the upper electrode 14*a*.

In a case where the thickness of the upper electrode 14*a* or the lower electrode 14*b* was sufficiently third relative to the thickness of the piezoelectric substrate 13, the effect of the resiliency of the upper electrode 14*a* and the lower electrode 14*b* to the displacement of the piezoelectric substrate 13 was negligible. However, as the thickness for the piezoelectric substrate 13 approaches the thickness for the upper electrode 14*a* or the lower electrode 14*b*, the effect thereof as the resilient member becomes non-negligible. Then, as shown in FIG. 11 and FIG. 12, the displacement of the micro-cantilever 11 can be enlarged by providing a thin-walled portion 16 formed by removing a portion of the upper electrode 14*a* slitwise to length α' and width β'.

Figure 12:
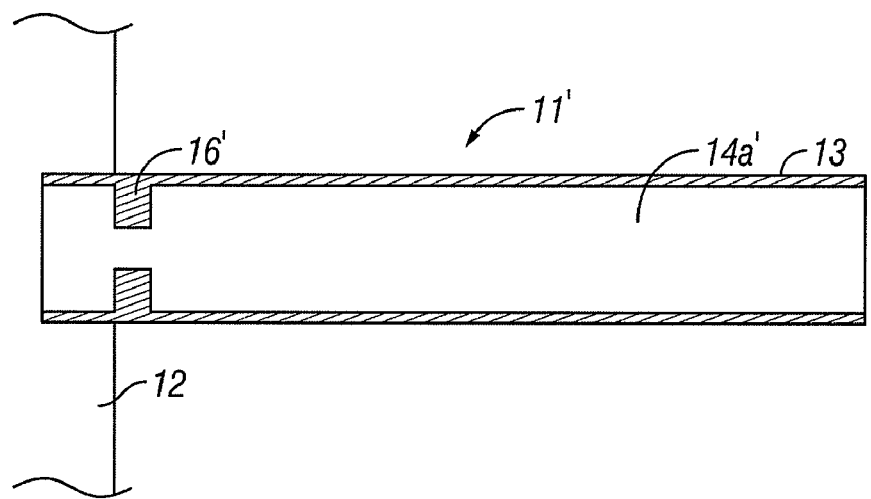
FIG. 12 is a schematic plan view showing another example of the second embodiment of the micro-cantilever according to the invention.

The thin-walled portion 16 is not restricted to the shape as in FIG. 11 but it may be a bisected shape as in the thin-walled portion 16' formed to the micro-cantilever 11' in FIG. 12. Further, the shape may be not only the rectangular slit but also other shapes or indefinite notched shapes. However, since the upper electrode 14*a* or 14*a*' has a role of applying the voltage to the piezoelectric substrate 13, it is necessary that a portion be left without removal.

When such a micro-cantilever 11 or 11' is manufactured, there may be used a method of forming a pattern by conducting masking or the like upon forming a metal film as the upper electrode 14*a* or 14*a*', or a method of forming a pattern upon etching. This can form the thin-walled portion 16 or 16'.

Then, the effect of the second embodiment of the micro-cantilever of the invention is to be described. By the manufacturing method described above, a micro-cantilever 11 having 500 μm length, 150 μm width, and 6.8 to 8.6 μm thickness is formed. The length is a distance from the fixing end of the support 12 to the top end. The size and the physical properties, etc. for each of the layers constituting the micro-cantilever 11 are as shown in Table 2.

TABLE 2

| | Unit | Si | Si oxide film | Lower electrode (Pt) | Piezoelectric layer (PZT) | Upper electrode (Pt) |
|---|---|---|---|---|---|---|
| Thickness | μm | 5 | 0.6 | 0.2 | 0.8 | 0,2, 1.0, 2.0 |
| Width | μm | 150 | 150 | 100 | 100 | 100 |
| Young's Modulus | Pa | 1.68E+11 | 6.80E+10 | 1.71E+11 | 7.30E+10 | 1.71E+11 |
| Piezoelectric constant d31 | — | — | — | — | −1.00E−10 | — |
| Relative permittivity | — | — | — | — | 1200 | — |

Then, micro-cantilevers having a thin-walled portion 16 with length α' fixed to 0.5 μm and the upper electrode 14a with thickness of 0.2 μm, 1.0 μm, and 2.0 μm (lower electrode 14b: 0.2 μm) were provided and specimens having width β' of 5 μm, 25 μm, 45 μm, 65 μm, and 75 μm for each thickness were prepared. A DC voltage at 10V was applied to each of the specimens, the displacement was measured, and the increment of displacement was calculated based on the displacement of a standard specimen not formed with the thin-walled portion being assumed as 100%. The result is shown in the graph of FIG. 13.

From the results, it has been found that increment of the displacement amount of about 5% at the maximum could be obtained by controlling the shape of the thin-walled portion 16 formed by removing a portion of the upper electrode 14a slitwise or notchwise. Further, it has been found that the effect of increasing the displacement obtained thereby may be more effective as the thickness of the upper electrode 14a approaches the thickness of the piezoelectric substrate 13.

The constitution shown in the first embodiment and the constitution shown in the second embodiment of the invention may be combined. In this case, since the effect of both of the constitutions can be provided, a larger displacement amount can be obtained at a lower voltage.

Since the micro-cantilever can be utilized as the driving portion of a micro-switch, it can be utilized, for example, to a band switching type tunable filter directed to WiMAX. Further, it is applicable also to high frequency switches, etc. for use in portable communication equipments including mobile telephones.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A micro-cantilever comprising:
   a substantially rectangular plate-like piezoelectric substrate having an upper electrode formed substantially over the entire surface on one surface and a lower electrode formed substantially over the entire surface on the other surface thereof;
   a plate-like resilient member in close contact with the surface of the piezoelectric substrate formed with the lower electrode so as to be structurally integral therewith; and
   a support configured to support, in the cantilever manner, the vicinity at one end in the longitudinal direction of a driving member formed by close contact of the piezoelectric substrate and the resilient member, wherein a thin-walled portion having a thickness less than that of other portions of the driving member is formed to the vicinity of a base portion of the driving member supported by the support.

2. The micro-cantilever according to claim 1, wherein the thin-walled portion is a portion where the thickness of the resilient member is decreased.

3. The micro-cantilever according to claim 1, wherein the thin-walled portion is a portion where a portion of the upper electrode is slit-like or notch-like shape.

4. A cantilever comprising:
   a piezoelectrically movable member attached to a support member in a cantilever manner, the movable member comprising a fixed segment supported by the support member and an unfixed segment movable with respect to the support member, wherein at least a portion of the unfixed segment proximal to the support member is substantially thinner than a portion of the unfixed segment distal from the support member.

5. The cantilever according to claim 4, wherein the thinner portion is about 10% to 80% of the distal portion thickness.

6. The cantilever according to claim 4, wherein the unfixed segment is configured to bend toward or away from the support member when a voltage is applied across the movable member.

7. A method of making a cantilever, the method comprising:
   forming a piezoelectrically movable member attached to a support member in a cantilever manner, the movable member comprising a fixed segment supported by the support member and an unfixed segment movable with respect to the support member, wherein at least a portion of the unfixed segment proximal to the support member is substantially thinner than a portion of the unfixed segment distal from the support member.

\* \* \* \* \*